(12) United States Patent
Hiiro

(10) Patent No.: US 6,385,229 B1
(45) Date of Patent: May 7, 2002

(54) LASER

(75) Inventor: Hiroyuki Hiiro, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/206,973

(22) Filed: Dec. 8, 1998

(30) Foreign Application Priority Data

Dec. 8, 1997 (JP) .............................................. 9-336690

(51) Int. Cl.⁷ ................................................. H01S 3/08
(52) U.S. Cl. ........................................ 372/101; 372/92
(58) Field of Search ................................ 372/101, 102, 372/92, 108, 98

(56) References Cited

U.S. PATENT DOCUMENTS

| | | | |
|---|---|---|---|
| 4,649,351 A | 3/1987 | Veldkamp et al. | 330/4.3 |
| 4,813,762 A | 3/1989 | Leger et al. | 350/162.16 |
| 5,661,747 A | 8/1997 | Hiiro | 372/101 |

FOREIGN PATENT DOCUMENTS

| | | | |
|---|---|---|---|
| JP | 4-504930 | 8/1992 | H01S/3/18 |

OTHER PUBLICATIONS

"High–Radiance Room–Temperature GaAs Laser with Controlled Radiation in a Single Transverse Mode" Philipp–Rutz, IEEE Journal of Quantum Electronics, vol. QE–8, No. 7, Jul. 1972, pp. 632–641.

"High–Power, Diffraction–Limited, Narrow–Band, External–Cavity Diode Laser" Sharfin et al., Appl. Phys. Lett 54(18), May 1, 1989, pp. 1731–1733.

"High Modal Discrimination in a Nd:Yag Laser Resonator with Internal Phase Gratings", Leger et al., Optics Letters, vol. 19, No. 23, Dec. 1, 1994, pp. 1976–1978.

"Large–Area, Single–Transverse–Mode Semiconductor Laser with Diffraction–Limited Super–Gaussian Output", Mowry et al., Appl. Phys. Lett. 66(13), Mar. 27, 1995, pp. 1614–1616.

"Coherent Addition of AlGaAs Lasers Using Microlenses and Diffractive Coupling", Leger et al., Appl. Phys. Lett. 52(21) May 23, 1988, pp. 1771–1773.

"Coherent Beam Addition of GaAlAs Lasers by Binary Phase Gratings" Leger et al., Appl. Phys. Lett. 48(14), Apr. 7, 1986, pp. 888–890.

Primary Examiner—Paul Ip
Assistant Examiner—Gioacchino Inzirillo
(74) Attorney, Agent, or Firm—Sughure Mion, PLLC

(57) ABSTRACT

A laser beam having a high power and preferable quality is obtained by a laser using a laser medium having a wide active region or a large mode volume. The laser includes a laser source, first and second resonator mirrors as a laser resonator optical system, an array illuminator optical system which is placed within the resonator optical system and places, at even spacing in a plane perpendicular to an optical axis of the resonator, complex amplitude distributions including only a fundamental transverse mode in a uniform phase similar to a fundamental transverse mode component of a laser beam emitted from the laser beam source. A higher-order mode component is diffracted in an angle larger than its diffraction angle and eliminated outside the resonator.

3 Claims, 3 Drawing Sheets

LASER

BACKGROUND OF THE INVENTION

1. Field of the Invention

The present invention relates to a laser, and more specifically, to a laser having a resonator structure which efficiently generates only a fundamental transverse mode.

2. Description of the Related Art

Lasers have been widely used in scanners or the like in various fields, such as for reading information from a recording medium or for writing information therein, and lasers having higher powers are demanded.

As a method of obtaining a high-power laser, an oscillation mode volume increase in an amplification medium or in an active region is used. When this method is practically and simply carried out, it is effective to increase a transverse-direction volume of the amplification medium or a gain thereof.

However, when a power increase is attempted by using this method, transverse modes in higher orders generally oscillate, and oscillation of only a single transverse mode cannot be realized effectively. Therefore, it is impossible to focus an oscillating laser light to its diffraction limit, and a power density of the focused laser light is not proportional to an increase in an oscillation power. This problem is especially conspicuous in high-gain semiconductor lasers. As a high-power semiconductor laser, a broad-area semiconductor laser having a wide active region has been known. This device does not have a resonator structure having a mode selectivity such that only a single transverse mode can oscillate efficiently. Therefore, a multitude of high-order transverse modes oscillate at the same time and an oscillating laser light cannot be focused to its diffraction limit. As a result, a focused spot having a high power density cannot be obtained.

As a method to solve these problems, a variety of resonator systems to improve the mode selectivity have been proposed. Hereinafter, these resonator systems will be explained briefly.

(1) Spatial Filter Method

A technique wherein higher-order mode losses are increased relatively and a fundamental transverse mode in a lowest order is caused to oscillate efficiently by installing a spatial filter comprising a lens and a simple aperture has been known (see "High-Radiance Room-Temperature GaAs Laser With Controlled Radiation in a Single Transverse Mode (E. M. Phillip-Rutz, IEEE J. Quantum Electron QE-8, 632 (1972)", "High-power, diffraction-limited, narrow-band, external-cavity diode laser (W. F. Sharfin, J. Seppala, A. Mooradian, B. A. Soltz, R. G. Waters, B. J. Vollmer, and K. J. Bystrom Appl. Phys. Lett. 54,1731 (1989)", Japanese Patent Application Publication No. 4(1992)-504930 or the like).

However, such a laser can only relatively increase the higher-order mode losses, since the laser uses a simple single aperture. Therefore, spatial frequencies in the higher-order modes cannot be eliminated completely out of the resonator. As a result, the higher-order modes can be oscillation modes of the resonator when a gain is increased, despite the fact that the optical losses are increased. For this reason, an amplification medium having a high enough gain, such as a semiconductor laser, cannot suppress oscillation of the higher-order modes, and a plurality of higher-order modes oscillate together with the fundamental transverse mode.

(2) Mode Selecting Mirror Method

Another technique wherein only a desired spatial mode is caused to oscillate by using a resonator mirror having mode selectivity has also been known. As lasers using this technique, diffractive mode-selecting mirror methods 1 and 2 or the like have been known (see "High modal discrimination in a Nd:YAG laser resonator with internal phase gratings (J. R. Leger, D. Chen, and K. Dai, Opt. Lett. 19,1976 (1994)", "Large-area, single-transverse-mode semiconductor laser with diffraction limited super-Gaussian output (G. Mowry and J. R. Leger, Appl. Phys. Lett. 66,1614 (1995)"). However, they also have the same problem as the spatial filter method lasers do.

(3) Beam Addition Method

As a laser which solves the problems that the spatial filter method and the mode selecting mirror method have and causes a high-power fundamental transverse mode to oscillate, the present applicant, for example, has proposed a coherent beam addition laser which adds a plurality of laser beams onto a common axis and causes the added beam to oscillate as a single laser beam (see Japanese Unexamined Patent Publication No. 8(1996)-76054 (Japanese Patent Application No. 5(1993)-336318), "Coherent beam addition of GaAlAs lasers by binary phase gratings (J. R. Leger, G. J. Swanson, and W. B. Veldkamp, Appl. Phys. Lett. 48,888 (1986)", "Coherent addition of GaAlAs lasers using microlenses and diffractive coupling (J. R. Leger, M. L. Scott, and W. B. Veldkamp, Appl. Phys. Lett. 52,1771 (1988)", U.S. Pat. Nos. 4,649,351, and 4,813,762, and the like).

According to this technique, a special optical device called an array illuminator for adding a plurality of laser beams onto a common axis is used.

As an array illuminator, an optimally-designed phase grating, a polarizing device, a Fourier transform lens array or the like can be used. According to the coherent beam addition laser, the quality of a beam emitted from each laser medium is reflected in the quality of the added laser beam. Therefore, in order to obtain a fundamental transverse-mode beam, each laser medium needs to have a structure to emit only the fundamental transverse mode.

However, it is generally difficult and costly to produce a laser medium wherein a plurality of laser media emitting the fundamental transverse mode alone are laid out in an array.

According to the conventional techniques described in the above, it is difficult to obtain a preferable beam-quality laser causing only the fundamental transverse mode to oscillate efficiently, since a laser using a laser medium having a wide active region or a large mode volume generates a multitude of higher-order transverse modes at the same time. Therefore, it is difficult for a high oscillation-power laser to focus an oscillating laser beam to its diffraction limit and to obtain a high power density.

SUMMARY OF THE INVENTION

Based on consideration of the above problems, an object of the present invention is to provide a high-power, preferable beam-quality laser by causing only a fundamental transverse mode to oscillate efficiently, even when a laser medium having a wide active region or a large mode volume is used therein.

A laser of the present invention places a predetermined array illuminator optical system within its resonator structure, separates a component of a higher-order mode from a fundamental transverse mode component by diffracting the higher-order mode in an angle larger than a predetermined diffraction angle, and eliminates the higher-order mode component out of the resonator. In this manner, only the fundamental mode component can oscillate, generating a laser beam.

In other words, the laser of the present invention comprises:

a laser resonator optical system; and an array illuminator optical system placed within the resonator optical system, the array illuminator optical system placing a plurality of complex amplitude distributions similar to that of an incident laser beam at even spacing and in a uniform phase in a plane perpendicular to an optical axis of the laser resonator.

The term "similar to" herein referred to means a state wherein a pattern the same as a fundamental complex amplitude distribution occurs in a space smaller than that of the fundamental distribution, and this meaning is the same as generally used in geometry or the like.

As the array illuminator optical system, an array illuminator optical system comprising:

a Fourier plane array illuminator using a first lens array or a first phase grating;

a Fourier transform lens for carrying out a Fourier transform on a complex amplitude distribution of a laser beam having passed through the Fourier plane array illuminator; and a Fourier plane array illuminator using a second lens array or a second phase grating which corrects a phase of and collimates each laser spot in a laser spot array formed at even spacing on a Fourier transform plane of the Fourier transform lens can be applied.

When the array illuminator optical system comprises the Fourier plane array illuminator using the first lens array, the Fourier transform lens, and the Fourier plane array illuminator using the second lens array, it is preferable for the array illuminator optical system to be set such that $$f \times p2 = f2 \times p1 \times A2 \quad (1)$$

$$f \times p1 = f1 \times p2 \times A1 \quad (2)$$

$$(p1 \times p2)/(\lambda \times f) = I \quad (3)$$

(where I is an integer other than 0)
are satisfied. Here, f1, p1, and A1 mean a focal distance, a pitch, the number of generated complex amplitude distributions of the Fourier plane array illuminator using the first lens array respectively, and f is a focal distance of the Fourier transform lens. Likewise, f2, p2, and A2 are a focal distance, a pitch, the number of generated complex amplitude distributions of the second lens array respectively, and λ means a wavelength of the laser beam.

As the laser resonator optical system, a ring resonator can be used as well. Furthermore, the laser beam is not limited to a specific one, and all kinds of laser beams can be adopted.

According to the laser of the present invention, the array illuminator optical system within the resonator optical system places a laser beam incident thereon as a plurality of complex amplitude distributions similar to that of the laser beam in an equal interval and in a uniform phase in a plane perpendicular to the optical axis of the laser resonator. When the incident laser beam has a complex amplitude distribution in a fundamental transverse mode, the complex amplitude distributions placed at the even spacing and the uniform phase are added onto the optical axis to generate a wave front having the uniform phase, which propagates along the optical axis. Meanwhile, when the incident laser beam has a higher-order transverse mode, the complex amplitude distributions placed at the even spacing and the uniform phase are added to generate a wave front having a spatial frequency higher than the frequency determined by the even pitch. Therefore, the wave is diffracted and deviated from the optical axis in an angle larger than the angle determined by the pitch. Therefore, the fundamental transverse mode component having the constant phase can propagate along the optical axis without a loss in light quantity, and a laser beam is generated by the resonator optical system. At this time, the higher-order transverse mode component is not a target of laser-beam oscillation caused by the resonator optical system.

The laser of the present invention can generate a laser beam including only a fundamental transverse mode component in the uniform phase, even when a laser medium having a wide active region or a large mode volume is used therein. Therefore, a high-power, high-quality laser beam can be obtained.

DESCRIPTION OF THE PREFERRED EMBODIMENTS

Hereinafter, embodiments of a laser of the present invention will be explained with reference to the accompanying drawings.

Figure 1:
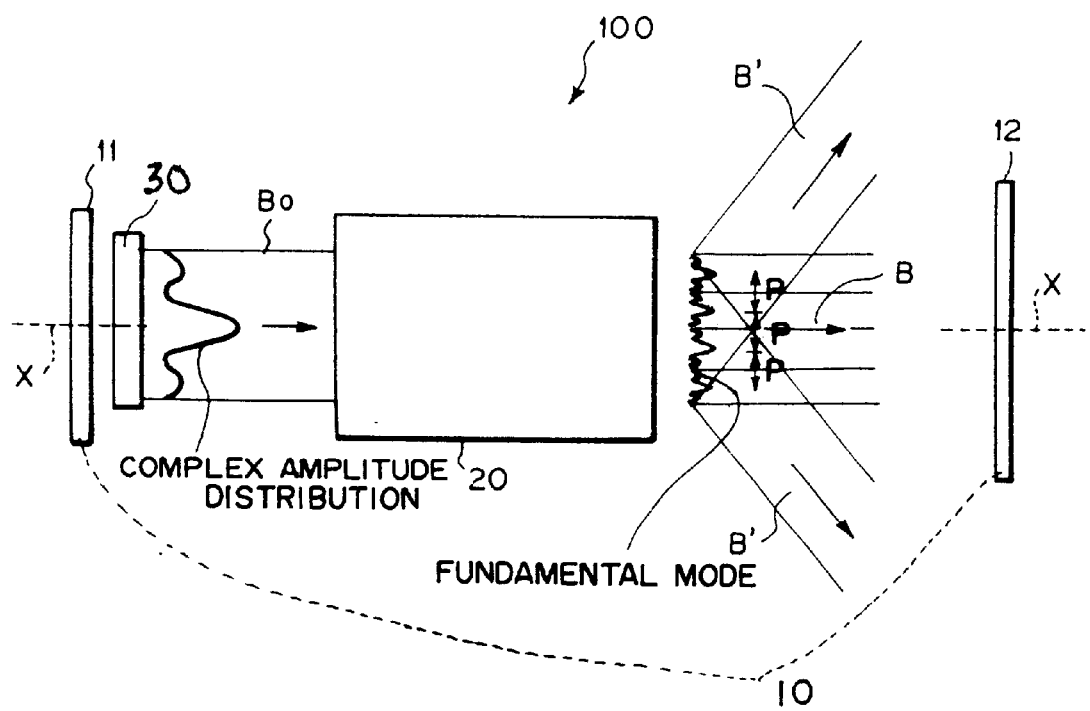
FIG. 1 is a diagram showing a configuration of a basic embodiment of a laser of the present invention.

FIG. 1 shows a configuration of a basic embodiment of the laser of the present invention.

A laser 100 has a standing-wave type resonator configuration, and comprises a laser source 30 comprising an exciting energy source and a laser medium, a first and a second resonator mirrors 11 and 12 as a laser resonator optical system 10, and an array illuminator optical system 20 within the resonator optical system 10 for placing, in an even pitch p and in a uniform phase, a plurality of complex amplitude distributions similar to that of a laser beam B0 emitted from the laser source 30 in a plane perpendicular to an optical axis X of the laser resonator.

A basic operation of the laser 100 will be explained next.

The laser beam B0 emitted from the laser source 30 toward right in FIG. 1 enters the array illuminator optical system 20 and the complex amplitude distributions similar to that of the laser beam B0 are placed at the even spacing and in the uniform phase in the plane perpendicular to the optical axis of the laser resonator optical system 10. When the incident laser beam B0 has a fundamental transverse mode component, the complex amplitude distributions placed at the even spacing and in the uniform phase are added onto the optical axis X to generate a wave front B having the uniform phase, which propagates along the optical axis. Meanwhile, when the incident laser beam B0 has a higher-order transverse mode, the complex amplitude distributions placed at the even spacing and in the uniform phase are added to generate a wave front B' having a spatial frequency higher than that determined by the even spacing.

Therefore, the added waves are diffracted and deviated from the optical axis X in an angle larger than the angle determined by the pitch.

The uniform-phase fundamental transverse-mode component B thus propagates along the optical axis X and is caused to oscillate by the resonator optical system 10. However, the higher-order mode component B' deviates from the path of a target of resonance by the resonator optical system 10, and this higher-order component is not a target of lasing as a consequence.

As has been described above, the laser 100 of the present invention generates a laser beam including only a fundamental transverse mode component having the uniform phase. Therefore, a high-power, high-quality beam can be obtained.

Figure 2:
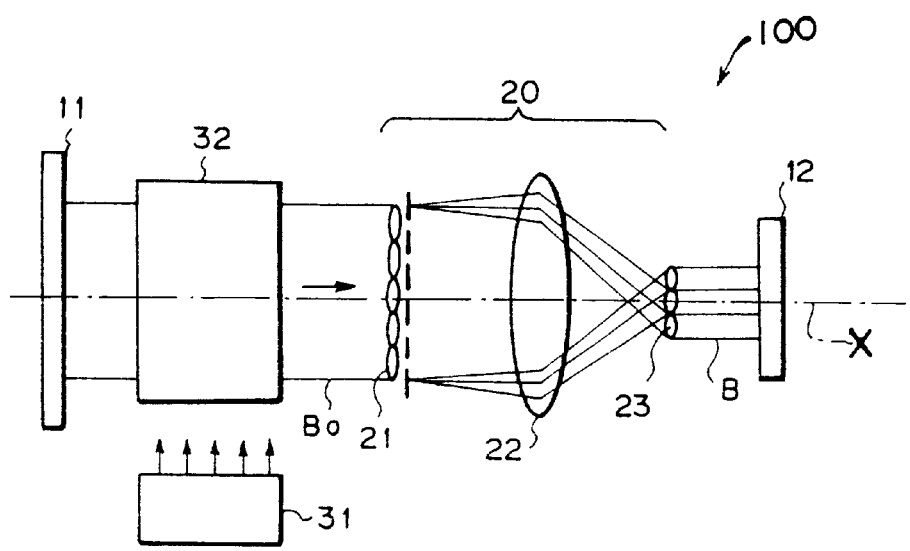
FIG. 2 is a diagram showing in detail a configuration of a laser 100 of the embodiment shown in FIG. 1.
Figure 3:
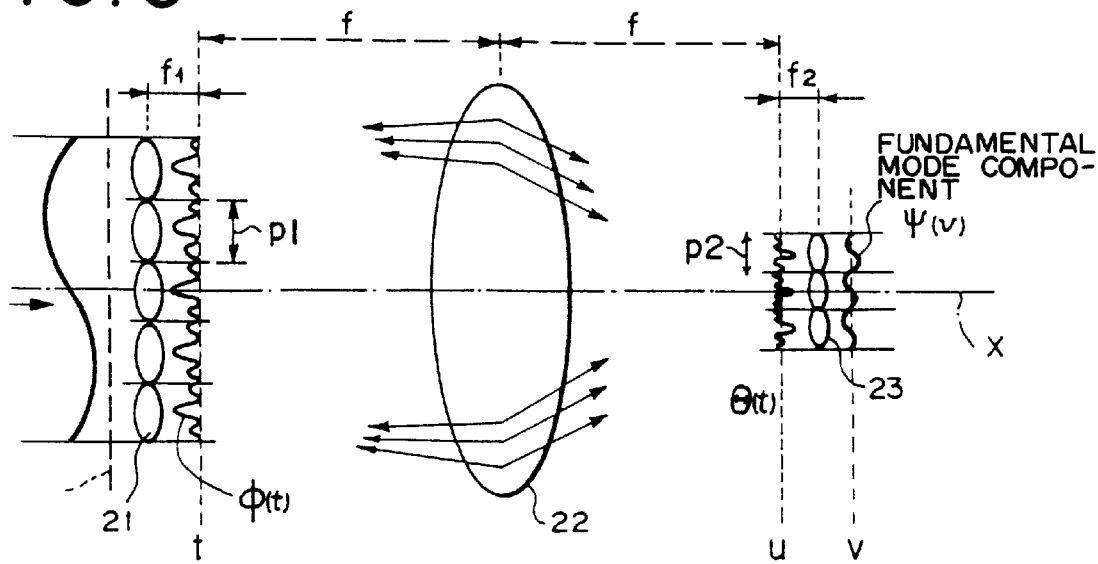
FIG. 3 is a diagram showing in detail a configuration of an array illuminator optical system 20 in the laser 100 shown in FIG. 2.

FIG. 2 shows a detailed configuration of the laser 100 in this embodiment shown in FIG. 1. The laser 100 in FIG. 2 uses, as the array illuminator optical system 20 shown in FIG. 1, a Fourier plane array illuminator 21 using a first Fourier transform lens wherein a plurality of lenses are placed in an even pitch in 2 dimensional directions in a plane perpendicular to the optical axis X, a Fourier transform lens 22 which carries out Fourier transform on a complex amplitude distributions of the laser beam having passed through the Fourier plane array illuminator 21, and a second Fourier transform lens array 23 which collimates the respective laser spots in a laser spot array formed in an even pitch on a Fourier transform plane of the Fourier transform lens 22. As an exciting energy source composing the laser source 30, a laser diode (LD) 31 is used. As a laser medium, a YAG rod 32 is adopted. Furthermore, as shown in FIG. 3, when f1, p1, and A1 are a focal distance, a pitch, the number of complex amplitude distributions generated by the Fourier plane array illuminator using the first Fourier transform lens array respectively, f means a focal distance of the Fourier transform lens, f2, p2, and A2 are a focal distance, a pitch, the number of complex amplitude distributions generated by the Fourier plane array illuminator using the second Fourier transform lens array respectively, and λ means a wavelength of the laser beam, the above elements composing the array illuminator optical system 20 are placed such that $$f \times p2 = f2 \times p1 \times A2 \tag{1}$$

$$f \times p1 = f1 \times p2 \times A1 \tag{2}$$

$$(p1 \times p2)/(\lambda \times f) = I \tag{3}$$

(where I is an integer other than 0) are satisfied.

First, the case where a plane-wave laser beam B0 approximately equivalent to a fundamental transverse mode is emitted from the YAG rod 32 by the excited LD 31 is considered. Assume that a beam diameter of the plane-wave laser beam B0 is equal to p1×A2. The incident plane wave B0 is Fourier-transformed by each Fourier transform lens composing the first Fourier transform lens array 21. At this time, an amplitude distribution $\Phi(t)$ on a Fourier transform plane t of each lens composing the lens array 21 is expressed as follows. Here, it is assumed that 2L1+1=A2:

$$\Phi(t) = C1 \sum_{L1=-L1}^{L1} \mathrm{Sinc}\left[\frac{p1}{\lambda f1}(t - l1p1)\right] \tag{4}$$

where C1 is a constant of proportion.

The laser beam having the amplitude distribution given by Equation (4) passes the Fourier transform lens 22 and Fourier transform is carried out thereon by the Fourier transform lens 22. An amplitude distribution $\Theta(u)$ expressed by Equation (5) below is formed on an Fourier transform plane u on the back side of the Fourier transform lens 22:

$$\Theta(u) = C2 \, \mathrm{Rect}\left(\frac{f1u}{plf}\right) \sum_{L1=-L1}^{L1} \exp\left(-2\pi i \frac{l1p1}{\lambda f} u\right) \tag{5}$$

where C2 is a constant of proportion.

The laser beam having the amplitude distribution given by Equation (5) passes the second Fourier transform lens array 23. An amplitude distribution $\Psi(v)$ having been Fourier-transformed by each lens in the lens array 23 is generated on an Fourier transform plane v on the back side of the Fourier transform lens array 23 and expressed by Equation (6) below. Here, it is assumed that 2L2+1=A1.

$$\Psi(v) = C3 \sum_{L1=-L2}^{L1} \sum_{L2=-L2}^{L2} \exp\left(-\frac{2\pi i}{\lambda f} l1l2p1p2\right) \mathrm{Sinc}\left[\frac{p2}{\lambda f2}\left(v + \frac{plf2l1}{f} - p2l2\right)\right] \tag{6}$$

where C3 is a constant of proportion.

By causing the array illuminator optical system 20 to satisfy Equation (3) in the above, a phase term in Equation (6) is canceled and the laser beam having passed through the second Fourier transform lens array 23 has the uniform-phase wave front.

By satisfying Equation (1), Equation (6) becomes Equation (7) below:

$$\Psi(v) = C4 \sum_{L1=-L2}^{L1} \sum_{L2=-L2}^{L2} \mathrm{Sinc}\left[\frac{p2}{\lambda f2}\left(v + \frac{p2}{A1}n - p2l2\right)\right] \tag{7}$$

where C4 is a constant of proportion.

As is obvious from Equation (7), the laser beam having passed through the second Fourier transform lens array 23 has amplitude distributions, expressed by Sinc functions, such that the distributions are placed at the even spacing and in the uniform phase.

The distribution expressed by Equation (7) on the Fourier transform plane v on the back side of the second Fourier transform lens array 23 can be considered as a plane wave propagating along the optical axis X when I=1 in Equation (3). When I≠1, a component having a higher-order spatial frequency is generated depending on the interval of the amplitude distribution expressed by the Sinc function. However, most of the amplitude distributions are concentrated on the plane wave propagating along the optical axis X.

Therefore, when an even spacing condition (Equation (1)) and a uniform phase condition (Equation (3)) of the array illuminator optical system 20 are satisfied, most of the quantity of the light of the plane wave B0 having entered each lens of the first Fourier transform lens array 21 is added to become a plane wave emitted along the direction of the optical axis X from the second Fourier transform lens array 23.

The case where a higher-order transverse mode component enters the first Fourier transform lens array 21 will be considered next. The complex amplitude distribution in the higher-order transverse mode is divided and focused by each lens composing the first Fourier transform lens array 21 at each lens position and a focused spot array reflecting the complex amplitude distribution at each position is then formed on the Fourier transform plane t.

The focused spot array is image-formed on the Fourier transform plane v on the back side of the second Fourier transform lens array 23 by the Fourier transform lens 22 as well as each lens composing the second Fourier transform lens array 23. Therefore, on the Fourier transform plane v, complex amplitude distributions similar to that of the higher-order transverse mode are copied and become complex amplitude distributions placed in the pitch p2 of the second Fourier transform lens array.

The complex amplitude distributions having passed through the second Fourier transform lens array 23 have only the spatial frequencies higher than the frequency of the pitch p2 of the second Fourier transform lens array 23, and no spatial frequency lower than that of the array pitch p2 is included.

The higher-order spatial frequency components are without fail diffracted outside the diffraction angle which depends on the array pitch p2. Therefore, by using an appropriate resonator configuration or a special filter, it becomes possible to completely eliminate the spatial frequency components in the higher-order transverse modes from the resonator, and only a fundamental transverse mode component in the uniform phase remains along the optical axis X.

As has been described in the above, according to the laser of the present invention, a higher-order transverse mode component is completely eliminated to the outside of the resonator and cannot be the oscillation mode of the resonator. Therefore, even when a laser medium having a wide active region or a large mode volume is used in the resonator, only the fundamental transverse mode component is generated efficiently and a laser beam having a high power and preferable quality can be obtained.

The above explanation is applicable to the case where the incident complex amplitude distribution in a higher-order transverse mode has only the spatial frequency component higher than that of the array pitch p1 of the first Fourier transform lens array 21.

When the higher-order mode having a frequency component higher than that of the first Fourier transform lens array 21 enters, a complex amplitude distribution having a spatial frequency component lower than that of the array pitch p2 of the second Fourier transform lens array 23 can pass the array illuminator optical system 20. In this case, if the array illuminator optical system 20 further satisfies Equation (2), the explanation in the above is applicable to the complex amplitude distribution of the laser beam entering from the both sides of the array illuminator optical system (from the sides of both the first and the second Fourier transform lens arrays 21 and 23).

Therefore, the laser beam having passed the second Fourier transform lens array 23 is reflected by the second resonator mirror 12 and re-enters the second Fourier transform lens array 23. The complex amplitude distribution at this time has only a component of spatial frequency lower than that of the array pitch p2 of the second Fourier transform lens array 23, and a higher-order spatial frequency component can be eliminated completely out of the resonator by causing the component to pass the array illuminator optical system 20 from the right in FIG. 2.

In order to completely eliminate the higher order spatial frequency component outside the resonator, it is desirable to have a long enough distance between the Fourier transform lens arrays (21 and 23) and the resonator mirrors (11 and 12).

If the spatial filter is applied, for the laser beam propagating from left to right, a lens to focus the laser beam is placed at a position on the path of the laser beam having passed through the Fourier transform lens array 23. At the focusing position of the lens, an aperture shutting a spatial frequency component equal to or larger than the diffraction angle corresponding to the pitch p2 of the Fourier transform lens array 23 is also placed so that the laser beam having passed through the aperture can be collimated again by a collimating lens or the like. Alternatively, a lens to focus the laser beam having passed through the Fourier transform lens array 23 is placed, and at a waist of the focused beam, a resonator mirror and an aperture shutting the spatial frequency component equal to or larger than the diffraction angle corresponding to the pitch p2 of the Fourier transform lens array 23 are placed. For the laser beam propagating from right to left, a lens to focus the laser beam is placed at a position on the path of the laser beam having passed through the Fourier transform lens array 21. At the focusing position of the lens, an aperture shutting a spatial frequency component equal to or larger than a diffraction angle corresponding to the pitch p1 of the Fourier transform lens array 21 is also placed so that the laser beam having passed through the aperture can be collimated again by a collimating lens or the like.

Figure 4A:
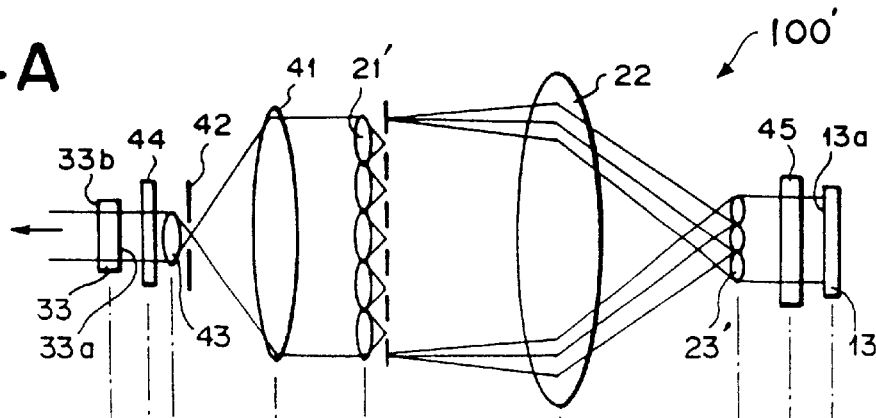
FIGS. 4A and 4B are a plane view A and a frontal view B showing a second embodiment of a laser of the present invention.
Figure 4B:
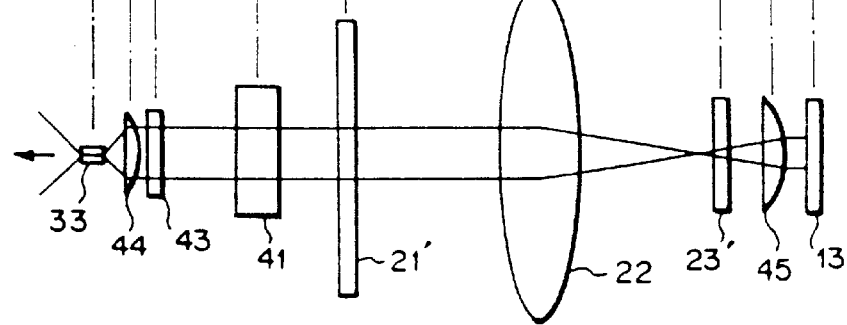

FIGS. 4A and 4B are diagrams showing a configuration in a top view A and a side view B of a second embodiment of a laser of the present invention.

The laser in this embodiment in FIG. 4 is different from the laser shown in FIG. 2 in the following points. A broad-area LD 33 is used as the laser source. As an array illuminator optical system, a first and second cylindrical lens arrays 21' and 23' and a Fourier transform lens 22 are used. The first and the second cylindrical lens arrays 21' and 23' have refractivity in a direction parallel to an active layer of the broad-area LD 33, on a plane perpendicular to an optical axis. A third and fourth cylindrical lenses 41 and 43 which magnify a laser beam emitted from the broad-area LD 33 in a direction parallel to the active layer thereof and cause the beam to enter the first cylindrical lens array 21', an aperture 42, and a fifth and sixth cylindrical lenses 44 and 45 for dealing with the beam as a parallel beam by collimating it in a direction perpendicular to the active layer are also used in this embodiment. An operation of this array illuminator optical system is the same as that of the embodiment shown by FIG. 2, and the explanation of the operation is not repeated here.

In the resonator optical system in this embodiment, a low reflection (LR) coating on an outer edge facet 33b of the broad-area LD 33, an antireflection (AR) coating on an inner edge facet 33a thereof, and a high reflection coating (HR) on an outer edge facet 13a of the resonator mirror 13 are used.

Figure 5A:
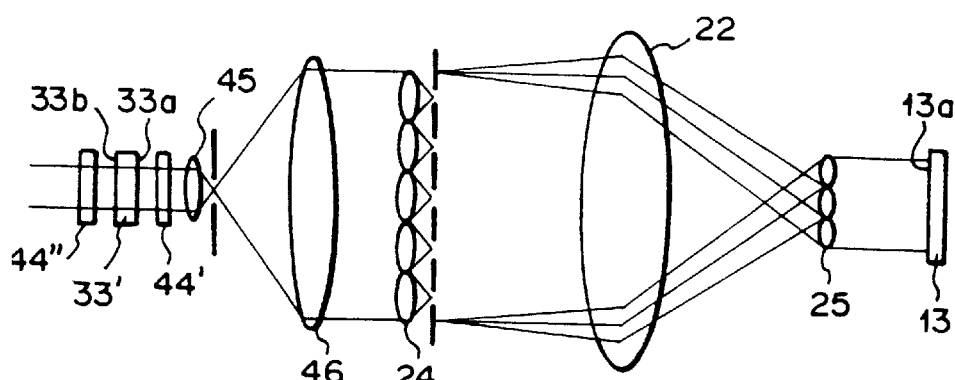
FIGS. 5A and 5B are a plane view A and a frontal view B showing a third embodiment of a laser of the present invention.
Figure 5B:
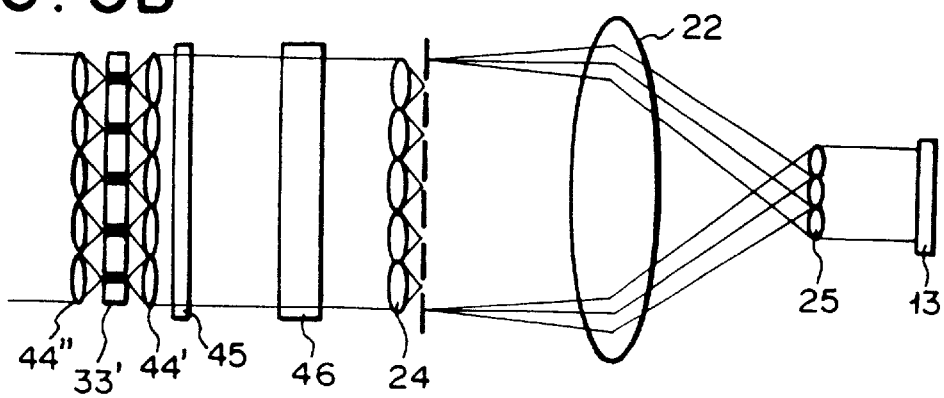

FIG. 5 shows a third embodiment of a laser of the present invention. The laser shown in FIG. 5 uses a multilayer broad-area LD 33' wherein a plurality of layers of broad-area LDs are stacked in a direction perpendicular to the active layer thereof. A laser beam emitted from the multilayer broad-area LD 33' is collimated collectively by cylindrical lens arrays 44', 44", 45 and 46 having refractivity in a direction perpendicular to the active layer of the multilayer broad-area LD 33' and placed in a pitch equal to that of the layer.

An array illuminator optical system in this embodiment uses a first 2-dimensional lens array 24 wherein a plurality of lenses are placed on a plane orthogonal to an optical axis in a predetermined pitch in directions parallel and perpendicular to the active layer of the multilayer broad-area LD 33', a Fourier transform lens 22 which carries out Fourier transform on a complex amplitude distribution of the laser beam having passed through the first 2-dimensional lens array 24, and a second 2-dimensional lens array 25 which collimates each spot in a 2-dimensional spot array formed in a predetermined pitch on a Fourier transform plane of the Fourier transform lens 22.

The laser in this embodiment is different from the first laser in the following 2 points. In order to collectively collimate the laser beam emitted from the multilayer broad-area LD 33', the first and second cylindrical lens arrays 44' and 44" are placed in front of and back of the LD 33'. The first and second cylindrical lenses 45 and 46 magnify the laser beam in a direction parallel to the active layer of the LD 33' and lead the laser beam to the first 2-dimensional lens array 24. An operation of the laser in this embodiment is the same as that of the laser in the first embodiment. Therefore, no explanation of the operation is repeated here.

What is claimed is:

1. A laser comprising:

a laser resonator optical system; and an array illuminator optical system placed within the resonator optical system, the array illuminator optical system placing a plurality of complex amplitude distributions similar to that of an incident laser beam at even spacing and in a uniform phase in a plane perpendicular to an optical axis of the laser resonator, such that only a fundamental transverse component in a uniform phase is generated along the optical axis of the laser resonator, wherein the array illuminator optical system includes, a Fourier plane array illuminator using one of a first lens array and a first phase grating;

a Fourier transform lens for carrying out a Fourier transform on a complex amplitude distribution of a laser beam having passed through the Fourier plane array illuminator; and a Fourier plane array illuminator using one of a second lens array and a second phase grating which corrects a phase of and collimates respective laser spots in a laser spot array formed at even spacing on a Fourier transform plane of the Fourier transform lens.

2. A laser as claimed in claim 1 wherein the array illuminator optical system comprises the Fourier plane array illuminator using the first lens array, the Fourier transform lens, and the Fourier plane array illuminator using the second lens array, and wherein $$f \times p2 = f2 \times p1 \times A2 \tag{1}$$

$$f \times p1 = f1 \times p2 \times A1 \tag{2}$$

$$(p1 \times p2)/(\lambda \times f) = I \tag{3}$$

(where I is an integer other than 0)

are satisfied in at least one plane parallel to an optical axis, where f1, p1, and A1 mean a focal distance, a pitch, a number of generated complex amplitude distributions of the Fourier plane array illuminator using the first lens array respectively, f is a focal distance of the Fourier transform lens, f2, p2, and A2 are a focal distance, a pitch, a number of generated complex amplitude distributions of the Fourier plane array illuminator using the second lens array respectively, and $\lambda$ means a wavelength of the laser beam.

3. A laser comprising:

a laser resonator optical system; and array illuminator optical means provided within the laser resonator optical system, for generating a laser beam including only a fundamental transverse mode component having a uniform phase along an optical axis of the laser resonator.

* * * * *